United States Patent [19]
Nakamori

[11] Patent Number: 5,995,370
[45] Date of Patent: Nov. 30, 1999

[54] HEAT-SINKING ARRANGEMENT FOR CIRCUIT ELEMENTS

[75] Inventor: Toshihiro Nakamori, Osaka, Japan

[73] Assignee: Sharp Kabushiki Kaisha, Osaka, Japan

[21] Appl. No.: 09/129,943

[22] Filed: Aug. 6, 1998

[30] Foreign Application Priority Data

Sep. 1, 1997 [JP] Japan ..................................... 9-235544

[51] Int. Cl.$^6$ ..................................................... H05K 7/20
[52] U.S. Cl. ........................... 361/704; 361/707; 361/708; 361/709; 361/749; 361/750; 361/751; 361/785; 174/252; 174/254; 165/185
[58] Field of Search ..................................... 361/690, 704, 361/707, 714–721, 749, 750; 257/723, 712; 174/52.4, 250–252

[56] References Cited

U.S. PATENT DOCUMENTS

| | | | |
|---|---|---|---|
| 4,811,165 | 3/1989 | Currier et al. | 361/716 |
| 4,858,071 | 8/1989 | Manabe et al. | 361/720 |
| 5,229,916 | 7/1993 | Frankeny et al. | 361/718 |
| 5,428,190 | 6/1995 | Stopperan | 174/261 |
| 5,631,807 | 5/1997 | Griffin | 361/794 |
| 5,708,297 | 1/1998 | Clayton | 361/720 |

FOREIGN PATENT DOCUMENTS 10-41442 2/1998 Japan .

OTHER PUBLICATIONS

Nikkei Microdevices, pp. 139–140, Mar. 1997.

*Primary Examiner*—Leo P. Picard
*Assistant Examiner*—Boris L. Chervinsky
*Attorney, Agent, or Firm*—Birch, Stewart, Kolasch & Birch, LLP

[57] ABSTRACT

An effective heat-sinking arrangement is realized for circuit elements used in a portable type information terminal having a small restricted space therein. Wherein, a first substrate has a cavity formed in its insulating layer extending to an earthing layer and filled with a silver paste to form a seat for mounting a CPU that can thus thermally contact with the earthing layer, and a second substrate has a cavity formed in an insulating layer in which cavity a heat-conducting cushion bonded to the top of the CPU is fitted for creating the heat-conductive route between the CPU and the earthing layer of the second substrate.

14 Claims, 3 Drawing Sheets

HEAT-SINKING ARRANGEMENT FOR CIRCUIT ELEMENTS

BACKGROUND OF THE INVENTION

The present invention relates to heat-sinking arrangement for circuit elements, e.g., central processing units (CPU) incorporated in information apparatuses, specially portable computer terminals, which elements require sinking heat produced by them.

A CPU and other electronic components mounted on a printed substrate should be surely protected from being self heated in working state to assure normal operation of them. Many kinds of protections have been proposed and applied.

FIG. 1 shows an exemplified cooling arrangement for a CPU used in a universal type desk-top personal computer. In the shown construction, a cooling fan 33 is directly attached to the top of the CPU 32 mounted on a substrate 31. Namely, the CPU 32 is forcibly cooled by the cooling fan 33. In FIG. 6, numeral 34 designates a lead wire of the CPU 32.

FIG. 2 shows an exemplified cooling arrangement for a CPU used in a portable type personal computer that has no space for mounting a cooling fan for cooling the CPU. Therefore, the CPU 32 mounted on a substrate is provided at its top with and a cushion 36 made of electrically insulating and thermally conducting material and a radiation metal plate 35 for transferring heat from the CPU 32.

FIG. 3 shows another exemplified cooling arrangement for a CPU used in a further compact portable type personal computer. The computer has further restricted spacing above the CPU in a housing. Therefore, the multilayer substrate 37 on which the CPU is mounted is used for radiating heat from the CPU 32.

Namely, the multilayer substrate 37 has a cavity 39 that extends to an earthing copper layer formed in the depth thereof and is filled with, e.g., silver paste 40 or a copper-made spacer. The CPU 32 is mounted on the thus prepared seat of the substrate. The CPU can now be in contact with the earthing layer 38 through which heat radiation from the CPU is dissipated. In FIG. 3, numeral 41 designates an insulating layer of the substrate.

However, the arrangement shown in FIG. 3 for dissipating heat away from the CPU through the earthing copper layer 38 formed in the depth of the substrate 37 has a small heat-transfer effect and can not sufficiently dissipate heat away from the CPU through the substrate.

The arrangements shown in FIGS. 1 and 2 are excellent to cool the CPU or dissipate heat away from the CPU but cannot be applied in a miniature type computer smaller than the portable type because the former has no space for accommodating the fan 33 or the heat-radiation plate. The arrangements of FIGS. 1 and 2 are designed to improve the effect of transferring heat from the CPU mounted on a substrate by providing a large space around the CPU in the housing.

SUMMARY OF THE INVENTION

It is an object of the present invention to provide a heat-sinking arrangement for a circuit element, which arrangement can realize effective heat-sinking for the elements using a restricted space in a portable information terminal.

It is another object of the present invention to provide a heat-sinking arrangement in which a first substrate with a circuit element mounted thereon is electrically connected to a second substrate having a conductor layer by means of a heat-conducting and electro-conducting connecting member so as to transfer heat from the circuit element, in practice, the second substrate is disposed with the heat-conducting member on the top of the circuit element mounted on the first substrate.

It is another object of the present invention to realize the heat-sinking arrangement in which heat emitted from the circuit element through the heat-conducting member is transferred to the conductor layer of the second substrate from which it is then given off, the conductor layer of the second substrate is preferably exposed to air to increase the heat-radiating effect.

It is another object of the present invention to provide a heat-sinking arrangement in which the first and second substrates are electrically connected to each other through the connecting member, so the second substrate can mount electronic parts on its surface opposing to that of the first substrate, thus increasing the working surface of the substrates.

It is another object of the present invention to provide a heat-sinking arrangement in which a flexible wiring substrate may be used as a connector for connecting the substrates, it makes easier to accurately position the heat-conducting member relative to the substrates, thus improving the productability of the arrangement.

It is another object of the present invention to provide a heat-sinking arrangement in which the earthing conductor layer of the first substrate is electrically connected to the conductor layer of the second substrate, in this case, the latter layer can also serve as a noise shielding plate.

It is another object of the present invention to provide a heat-sinking arrangement of a circuit element for dissipating away heat radiation from the circuit element mounted on a substrate through a conductor layer formed in the same substrate, wherein the conductor layer partly exposed on the top of the substrate is provided with a heat-conducting member contacting at the top surface with the circuit element, substrate comprising a rigid-flexible wiring substrate that is folded to sandwich the circuit element, thus creating a heat-conductive route between the substrate and the circuit element.

This arrangement realizes effective heat-radiation from the circuit element through the outwardly exposed conductor layer. The flexible substrate is effective to mount electronic parts thereon.

The conductor layer of the substrate can be connected through the heat-conducting member to an inner wall of the housing wherein the substrates are accommodated. This considerably increases the heat-radiating surface, assuring an improved heat-radiation effect.

PREFERRED EMBODIMENT OF THE INVENTION

First Embodiment

Figure 4:
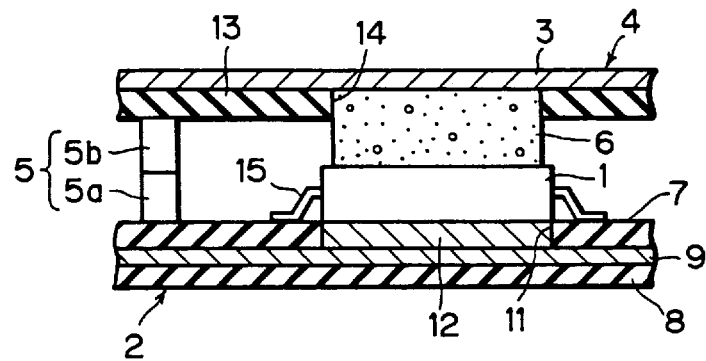
FIG. 4 shows a heat-sinking arrangement of circuit elements, which is a first embodiment of the present invention.

FIG. 4 illustrates a heat-sinking arrangement of a circuit element (CPU in particular), which is a first embodiment of the present invention. This heat-sinking arrangement is such that a first substrate 2 with a CPU 1 mounted thereon is connected to a second substrate 4 having an earthing conductor layer 3 through a conducting connector (connecting member) 5. The CPU 1 is thermally connected to the earthing conductor layer 3 of the second substrate 4 through an electro-insulating heat-conducting cushion (heat-conducting member) 6. In practice, the second substrate 4 is mounted on the heat-conducting cushion 6 disposed on the top of the CPU mounted on the first substrate.

The first substrate 2 is a so-called multilayer substrate that has insulating layers 7 and 8 made of epoxy resin or polyimide resin formed at its top and bottom respectively, an earthing layer 9 sandwiched between the top and bottom insulating layers 7 and 8 and other not-shown layers (a power supply layer and a signal layer). The earthing layer 9 made of conductive metal, e.g., copper (Cu) or silver (Ag), forms an earthing conductor pattern extending all over the substrate. The signal layer (not shown) is composed of a pattern of conductors between terminals of electronic parts inserted into or mounted on the insulating layer 7 of the second substrate 4 and insulating resin filling spaces between the conductor patterns.

The insulating layer 7 has a cavity 11 formed at its top layer portion. The cavity is deep to the earthing layer of the substrate and filled with silver (Ag) paste 12 to form a place for mounting the CPU 1 thereon. The CPU 1 mounted on the place is thus connected through the silver paste 12 to the even layer layer 9 of the substrate, which layer serves as a heat-radiating plate for emitting out the heat radiation from the CPU 1.

It is also possible to use, instead of the silver paste 12, a metal-made (e.g., copper) spacer inserted in the deep cavity 11 formed in the insulating layer 7 of the substrate. An electrically insulating heat-conducting cushion can be also applied in place of the silver paste 12 since the CPU 1 does not require the electrical connection with the earthing conductor layer 9.

The second substrate 4 is also a multilayer substrate comprising an insulating layer 13, an earthing layer 3, a power supply layer (not shown) and a signal layer (not shown). The earthing layer 3 is partly or entirely exposed at its top surface, by which it is distinct from the earthing layer of the first substrate. The insulating layer 13 has a cavity 14 extending to the earthing layer 3.

The top surface of the CPU 1 is covered with a substantially cuboid heat-conducting cushion 6 made of urethane resin or rubber. The cushion 6 is fitted at its upper portion in the cavity wherein it contacts with the earthing layer 3 of the second substrate 4. Namely, the CPU 1 is thermally contacting the earthing layer 3 of the second substrate 4 through the heat-conducting cushion 6. The earthing layer 3 of the second substrate 4 also serves as the heat-radiation plate for dissipating heat away from the CPU 1 as the earthing layer 9 of the first substrate 2 does.

Figure 1:
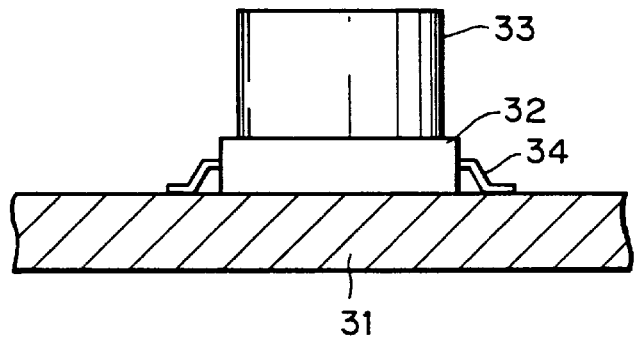
FIG. 1 shows a conventional cooling arrangement for circuit elements.
Figure 2:
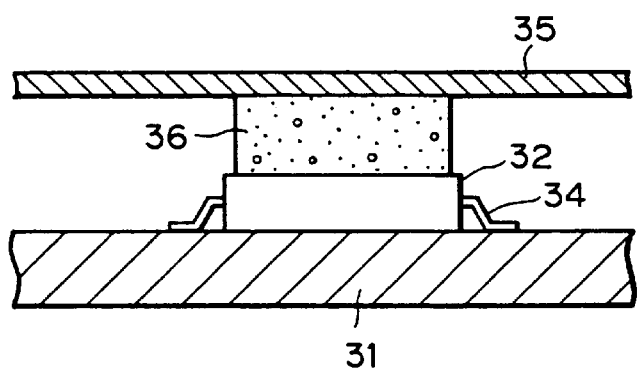
FIG. 2 shows another conventional heat-sinking arrangement for circuit elements.
Figure 3:
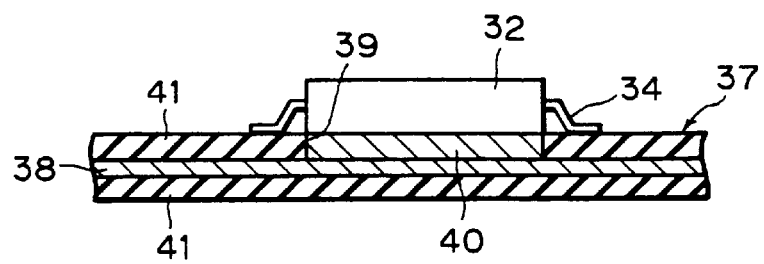
FIG. 3 shows another conventional heat-sinking arrangement for circuit elements.

It is, of course, to use, instead of the cushion 6, a heat-conducting metal-made member interposed between the CPU and the second substrate. However, the cushion 6 is still preferable to use in view of protecting the CPU 1 from any external force produced when one carries a portable information terminal in which the CPU 1 is mounted. A spring member may be also applied in place of the cushion 6. In FIG. 1, numeral 15 designates a lead wire of the CPU 1.

The first and second substrates 2 and 4 are electrically connected to each other by a substrate connector 5. The connector 5 comprises a socket (female-side half) 5a and a plug (a male-side half) 5b. The plug 5b is fitted in the socket 5a to create the electrical connection between the substrates. In other words, conductor patterns formed on the power supply layers, earthing layers and signal layers of both substrates are electrically coupled respectively by means of the connector 5.

The size of the connector 5 is preferably selected so that the first substrate 2 and the second 4 substrate can be maintained in parallel with each other at a specified distance assuring the reliable contact between the CPU 1, the heat conducting cushion 6 and the earthing layer of the second substrate. It is also possible to select the size of the heat conducting cushion 6 in accordance with the size of the connector 5.

Heat generated from the CPU 1 is transferred to the earthing layer 3 of the second substrate 4 through a first route with the cushion 6 and through a second route with the earthing layer 9 of the first substrate 6 and the connector 5.

Therefore, the arrangement realizes effective heat-radiation from the top and bottom surfaces of the CPU at a time through the earthing layers 9 and 3, respectively, of the first and second substrates 2 and 4. The earthing layer 3 of the second substrate 4 is exposed to further improve the effect of heat-radiation from the CPU 1.

The second substrate 4 can mount various kinds of electronic parts on its insulating layer 13 opposite to the insulating layer 7 of the first substrate 2 since the signal layer, power supply layer and earthing layer 3 thereof are electrically connected to those of the first substrate 2 through the connector 5. In this case, electronic parts are preferably arranged on the second substrate 4 so that they may not touch with any electronic part mounted on the first substrate 2.

The substrates 2 and 4 provide the considerably widened surfaces for mounting electronic parts with no need for a larger space in the housing of the information terminal device. It is also possible that some of the electronic parts mounted on the first substrate 2 are replaced on the substrate 4, thus enabling further reduction of the size of both the substrates. This can also reduce the space necessary for mounting the substrates in the device housing.

The earthing layer (with an earthing conductor pattern) 9 of the first substrate 2 is connected by the connector 5 to the earthing layer 3 of the second substrate 4, so the earthing layer 9 can also work as a noise shielding member assuring the same effect of noise protection as is obtainable by mounting a noise-shielding plate mounted on the CPU 1. Therefore, the described arrangement can also provide the effective noise-protection for the CPU 1.

Figure 5:
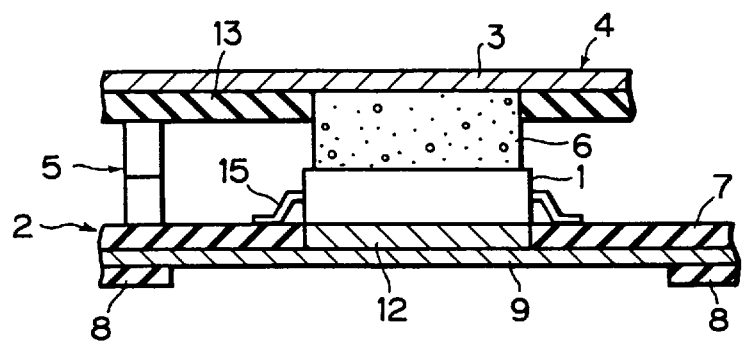
FIG. 5 shows a variation of the first embodiment of the present invention.

As shown in FIG. 5, the first substrate 2 may have the earthing layer 3 partly exposed in the removed portion of the bottom insulating layer 8.

Figure 6:
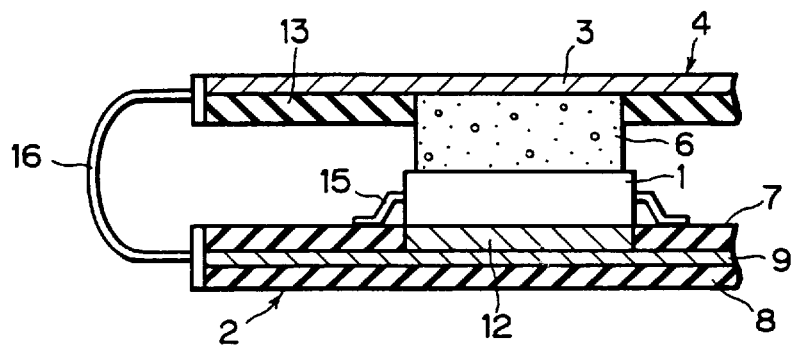
FIG. 6 shows another variation of the first embodiment of the present invention.

FIG. 6 illustrates a modification of the above-described embodiment. This modification differs from the embodiment only by the fact that the first and second substrates 2 and 4 are connected to each other by using, instead of the connector 5, a flexible wiring substrate 16 made of, e.g., polyimide film or polyester film.

The use of the flexible wiring substrate 16 allows the first and second substrates 2 and 4 to move in any desired horizontal direction maintaining a distance between them. This makes it easier to fit the heat-conducting cushion 6 bonded to the top of the CPU 1 into the cavity 14 formed in the second substrate 4 while manufacturing the above-described heat-sinking arrangement of the CPU 1. Therefore, the productability of the arrangement is improved, reducing the time of the manufacturing process. The same effect is also realized by using a flat cable for electrically connecting the first and second substrates 2 and 4 instead of the flexible wiring substrate 15.

Second Embodiment

Figure 7:
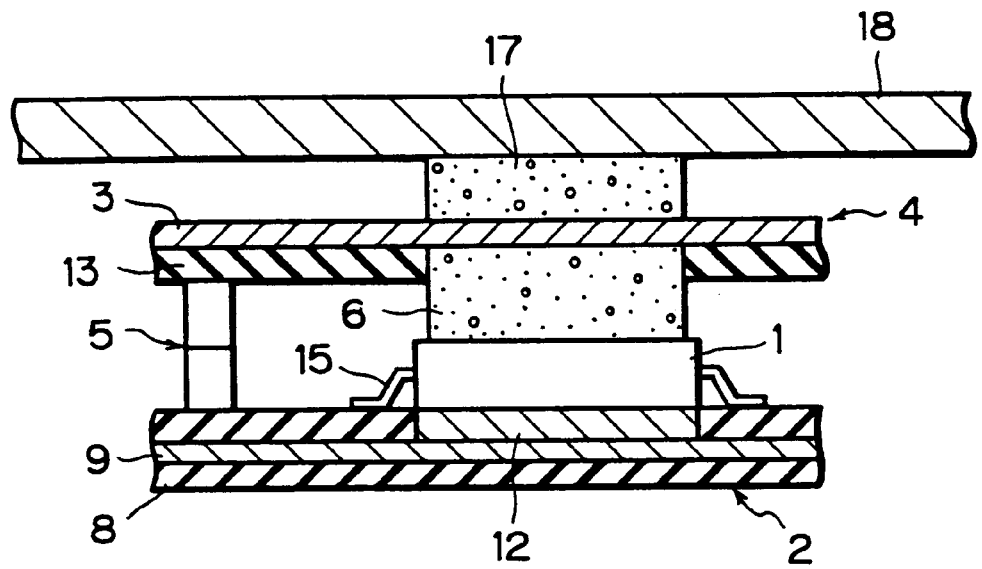
FIG. 7 shows a heat-sinking arrangement of circuit elements, which is a second embodiment of the present invention.

FIG. 7 illustrates a heat-sinking arrangement of a CPU according to the second embodiment of the present invention. This embodiment is featured by the fact that a heat-conducting cushion 17 is further provided on the top surface of an earthing layer 3 of a second substrate 4 in a heat-sinking arrangement that is the same as described in the first embodiment. Namely, the earthing layer 3 of the second substrate through the heat-conducting cushion 17 is in contact with a housing 18 in which the substrates 2 and 4 are accommodated.

In the second embodiment, the second substrate 4 is secured to the inner wall of the housing 18 by using a screw having a specified length in such a way that no spacing is left between the heat-conducting cushion 17 and the earthing layer 3 and between the heat-conducting cushion 17 and the inner wall of the housing 18. The other portions are the same as described in the first embodiment.

The earthing layer 3 exposed at the top of the second substrate 4 is in contact with the inner wall of the housing by means of the heat-conducting cushion 17. This makes the housing 18 be a heat-radiating member having a large radiating surface. The second embodiment assures a considerably improved effect of heat-radiation from the CPU as compared with the first embodiment.

Third Embodiment

Figure 8:
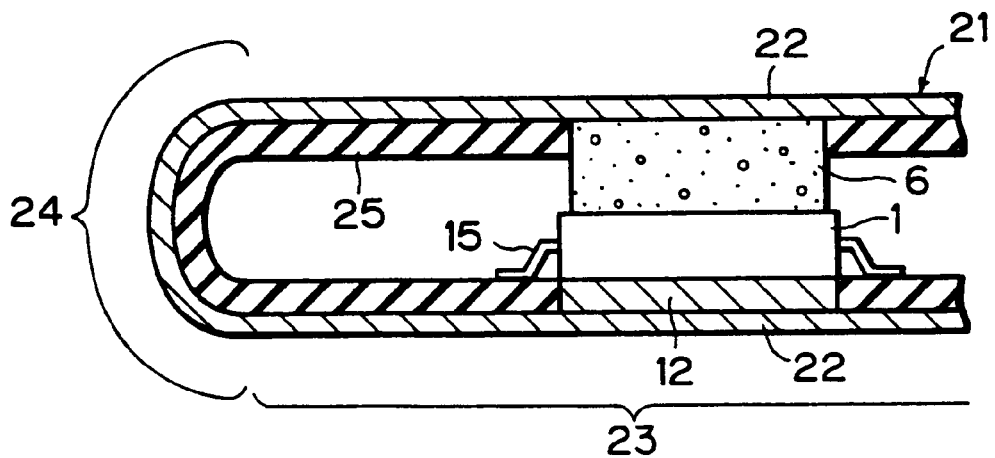
FIG. 8 shows a heat-sinking arrangement of circuit elements, which is a third embodiment of the present invention.

FIG. 8 illustrates a heat-sinking arrangement of a CPU according to the third embodiment of the present invention. This embodiment is featured by a substrate 21 in which the first and second substrates 2 and 4 shown in the first embodiment are integrally formed. The substrate 21 has an earthing layer 22 exposed at the top thereof and is thermally connected at the exposed portion to a CPU 1 through a heat-conducting cushion 6. Namely, the substrate 21 comprises a rigid-flexible wiring substrate in which a rigid portion 23 for mounting electronic parts and a flexible (foldable) portion are integrally formed. The substrate 21 has an earthing layer 22, an insulating layer 25, a signal layer (not shown) and power supply layer (not shown). The CPU 1 is sandwiched between two parts of the folded substrate 21, thus creating heat-conductive contact between the CPU 1 and the substrate 21. The other portions of this embodiment are similar to those of the first embodiment.

In this embodiment, the substrate 21 is folded with the earthing layer 22 exposed outwardly on the top side and the bottom side, thus increasing heat-radiation effect. The substrate 21 is foldable and therefore adapted to be fabricated and assembled with the CPU 1. This substrate eliminates the need of using a connecting member that is used for connecting the first and second substrates in the first embodiment. The number of parts is reduced.

The third embodiment may also be modified to create a heat-conducting route between the earthing layer 22 of the substrate 22 and the housing 18 through a heat conducting cushion 17 bonded to the top of the earthing layer 22.

While the described embodiments represent the preferred forms of the present invention, it is to be understood that various changes and modifications may be made within the scope of the appended claims. For example, it is possible to provide each the substrates 2 and 4 with radiating fins for giving off the heat from the CPU. Furthermore, the described heat-sinking arrangement of the invention is not limited to use for cooling CPUs and it may, of course, be applied to other electronic parts (e.g., power transistors and regulators with three terminals), which emit a relatively large amount of heat.

As described as above in the heat-sinking arrangement according to the present invention, the circuit element mounted on the first substrate has heat-conductive connection with the conductor layer of the second substrate through the heat-conducting member. Therefore, heat emitted from the circuit element to be transferred through the heat-conducting member to the conductor layer formed on the second substrate from which it is then emitted out. As compared with a conventional heat radiation in one direction from a circuit element to a conductor layer of a first substrate, the described heat-radiation is conducted in two directions, thus improving the heat-radiation effect. The conductor layer of the second substrate is partly exposed thereon to further improve the heat-radiation effect.

Since the first and second substrates are electrically connected with each other through the connecting member, heat emitted from the circuit element is transferred through the connecting member to the conductor layer of the second substrate. This does not only increase the heat radiation effect but also makes it possible to mount electronic parts on the second substrate. It is possible to densely mount electronic parts on the opposite surfaces of both substrates or to reduce the size of the substrates by distributing the mountable parts to them, thus realizing reduction of space for mounting the substrates in any apparatus.

A flexible wiring substrate may be used as a connector for connecting the substrates or a rigid-flexible substrate may be used as folded for sandwiching the circuit element. This makes it easier to position the heat-conducting member to the substrates, thus improving the productability of the construction.

The earthing conductor layer of the first substrate is electrically connected to the conductor layer of the second substrate. In this case, the latter layer can also function as a noise shielding plate. This provides an effective noise-protection of the high-speed operating CPU.

The conductor layer of the substrate can be connected through the heat-conducting member to an inner wall of the housing in which the substrates are accommodated. This increases the heat-radiating surface, thus improving the heat-radiating effect.

I claim:

1. A heat-sinking arrangement for circuit elements, which comprises:

a first substrate;

a first earthing conductor layer on the first substrate;

one or more circuit elements mounted on the first substrate;

a second substrate, wherein the second substrate is electrically connected with the first substrate;

a second earthing conductor layer on the second substrate;

a conductive connecting member connecting the first earthing conductor layer and the second earthing conductive member; and a heat-conducting member, wherein the circuit elements are thermally connected with the second earthing conductor layer on the second substrate through the heat conducting layer.

2. The heat-sinking arrangement for circuit elements as defined in claim 1, wherein the second substrate is disposed above the circuit elements mounted on the first substrate and the heat-conducting member is interposed between the circuit elements and the second substrate.

3. The heat-sinking arrangement for circuit elements as defined in claim 1 or 2, wherein a part of the second earthing conductive layer of the second substrate is outwardly exposed.

4. The heat-sinking arrangement for circuit elements as defined in claim 1, wherein the connecting member comprising a flexible wiring substrate.

5. The heat-sinking arrangement for circuit elements as defined in claim 1, wherein a ground conductor pattern formed on the first substrate is electrically connected to the conductor layer of the second substrate.

6. A heat-sinking arrangement for circuit elements, which comprises:

a folded rigid-flexible wiring substrate;

circuit elements mounted on the substrate;

an earthing conductor layer formed on the substrate, wherein the circuit elements are thermally contacted with the earthing conductor layer; and a heat conducting member, wherein a part of the earthing conductor layer is exposed as a top exposed surface so that the circuit elements are sandwiched between two parts of the folded rigid-flexible wiring substrate to form a heat-conductive contact, whereby the circuit elements are contacting through the heat conducting member.

7. The heat-sinking arrangement for circuit elements as defined in claim 1 or 6, further comprising a housing having an inner wall, wherein the conductor layer of each substrate is in contact with the inner wall through a heat conducting cushion.

8. The heat-sinking arrangement for circuit elements according to claim 1, wherein the earthing layers are made from a conductive metal selected from the group consisting of copper and silver.

9. The heat-sinking arrangement for circuit elements according to claim 1, wherein the earthing layers form an earthing conductor pattern extending over their respective substrates.

10. The heat-sinking arrangement for circuit elements according to claim 1, further comprising:

an insulating layer on the second substrate; and a signal layer, wherein the signal layer is composed of a pattern of conductors between terminals of electronic parts inserted into or mounted on the insulating layer of the second substrate.

11. The heat-sinking arrangement for circuit elements according to claim 1, further comprising:

insulating resin filling spaces in the pattern of conductors.

12. The heat-sinking arrangement for circuit elements according to claim 1, wherein the heat conducting member comprises urethane resin or rubber.

13. The heat-sinking arrangement for circuit elements according to claim 1, wherein the conductive connecting member comprises:

a socket (female side half); and a plug (male side half), wherein the plug is fitted in the socket to create an electrical connection.

14. The heat-sinking arrangement for circuit elements according to claim 1, wherein the circuit element comprises a CPU.

* * * * *